(12) United States Patent  
Toda et al.

(10) Patent No.: US 8,031,508 B2
(45) Date of Patent: Oct. 4, 2011

(54) RESISTANCE CHANGE MEMORY DEVICE

(75) Inventors: Haruki Toda, Yokohama (JP); Hirofumi Inoue, Kamakura (JP); Hiroto Nakai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 418 days.

(21) Appl. No.: 12/266,879

(22) Filed: Nov. 7, 2008

(65) Prior Publication Data

US 2009/0122598 A1 May 14, 2009

(30) Foreign Application Priority Data

Nov. 9, 2007 (JP) ................................. 2007-292040

(51) Int. Cl.
*G11C 11/00* (2006.01)
(52) U.S. Cl. ........................................ 365/148; 365/163
(58) Field of Classification Search .................. 365/148, 365/163, 210.1, 210.14, 210.15
See application file for complete search history.

(56) References Cited

U.S. PATENT DOCUMENTS

| 5,386,388 A | | 1/1995 | Atwood et al. | |
| 5,444,656 A | * | 8/1995 | Bauer et al. | 365/185.2 |
| 6,055,187 A | * | 4/2000 | Dallabora et al. | 365/185.21 |
| 6,778,426 B2 | | 8/2004 | Hosotani | |
| 7,423,898 B2 | * | 9/2008 | Tanizaki et al. | 365/148 |
| 2003/0231525 A1 | * | 12/2003 | Mine | 365/189.07 |
| 2006/0092689 A1 | | 5/2006 | Braun et al. | |

OTHER PUBLICATIONS

U.S. Appl. No. 12/668,750, filed Jan. 12, 2010, Toda, et al.
Y. Hosoi, et al., "High Speed Unipolar Switching Resistance RAM (RRAM) Technology", IEEE Int. Elec. Dev. Meeting, Technical Dig. 2006, 4 pages.

* cited by examiner

*Primary Examiner* — Vu Le
(74) *Attorney, Agent, or Firm* — Oblon, Spivak, McClelland, Maier & Neustadt, L.L.P.

(57) ABSTRACT

A resistance change memory device includes: a memory cell array with memory cells arranged therein, the memory cell having a variable resistance element for storing a rewritable resistance value; a reference cell formed of the same memory cells as those set in a high resistance state in the memory cell array, the reference cell being trimmed with selection of the number of parallel-connected memory cells to have a reference current value used for detecting data in the memory cell array; and a sense amplifier configured to compare a cell current value of a memory cell selected in the memory cell array with the reference current value of the reference cell.

21 Claims, 7 Drawing Sheets

Multi-level set with
a constant resistance difference

FIG. 10

Multi-level set with
a constant current difference

RESISTANCE CHANGE MEMORY DEVICE

CROSS-REFERENCE TO RELATED APPLICATION

This application is based on and claims the benefit of priority from the prior Japanese Patent Application No. 2007-292040, filed on Nov. 9, 2007, the entire contents of which are incorporated herein by reference.

BACKGROUND OF THE INVENTION

1. Field of the Invention

This invention relates to a resistance change memory device for storing a rewritable resistance value as data in a non-volatile manner, specifically relates to a reference cell used for detecting a selected cell's current.

2. Description of the Related Art

It has been proposed such a resistance change memory (ReRAM) that stores a resistance value as data, which is reversibly exchanged by applying voltage, current or heat, and it is noticed for succeeding to the conventional NAND-type flash memory. This resistance change memory is suitable for shrinking the cell size, and for constituting a cross-point cell array. In addition, it is easy to stack cell arrays.

Specifically, a unipolar type of ReRAM cell has such a feature that the high resistance state and low resistance state are reversibly settable by controlling the applied voltage and applying time thereof. For example, refer to Y. Hosoi et al, "High Speed Unipolar Switching Resistance RAM(RRAM) Technology" IEEE International Electron Devices Meeting 2006, Technical Digest, P. 793-796.

However, in accordance with the variation of the manufacturing process, the stable value of the resistance state of the recording layer may be changed for every memory chip based on a slight composition variation, and the wiring resistance also varies. In addition, in a memory chip having a three-dimensionally stacked cell array, the wiring resistance in the sense amplifier is largely changed dependent on the position in the cell array, so that it becomes difficult to judge a cell's resistance state as a constant data state in the whole memory chip.

Therefore, it is in need of setting data and reading data in a cell in consideration of the variation of the cell state in accordance with the manufacturing place and time, and the position in each memory chip. Usually, cell data read is performed in such a way as to compare a selected cell's current with a reference current of a reference cell with a sense amplifier. This is identical in both of the normal data read and the write-verify read.

SUMMARY OF THE INVENTION

According to an aspect of the present invention, there is provided a resistance change memory device including:

a memory cell array with memory cells arranged therein, the memory cell having a variable resistance element for storing a rewritable resistance value;

a reference cell formed of the same memory cells as those set in a high resistance state in the memory cell array, the reference cell being trimmed with selection of the number of parallel-connected memory cells to have a reference current value used for detecting data in the memory cell array; and a sense amplifier configured to compare a cell current value of a memory cell selected in the memory cell array with the reference current value of the reference cell.

According to another aspect of the present invention, there is provided a resistance change memory device including:

a memory cell array with memory cells arranged therein, the memory cell having a variable resistance element for storing a rewritable resistance value;

a reference cell array with reference cells arranged therein, the reference cells being formed of the same memory cells as those set in a high resistance state in the memory cell array and disposed in correspondence with the respective divided areas defined in the memory cell array; and a sense amplifier configured to compare a cell current value of a memory cell selected in the memory cell array with a reference current value of a reference cell selected in the reference cell array, wherein the reference cells each include parallel-connected memory cells, and reference current values of the reference cells are trimmed in such a way as to select the number of parallel-connected memory cells and compare the cell currents with those of monitor cells defined in the respective divided areas.

DETAILED DESCRIPTION OF THE EMBODIMENTS

Prior to the explanation of an embodiment, it will be explained such a situation that it is in need of precisely trimming a reference cell when sensing data of a resistance change memory (ReRAM) by applying a small voltage to a cell and comparing the cell current with a reference current.

It is a sense amplifier to compare the cell current with the reference current. However, a cell state that the sense amplifier detects is not the cell resistance state itself, but contains a parasitic resistance of a current path, such as a bit line and the like, from the sense amplifier to the accessed cell.

The parasitic resistance is not constant because it is affected by the manufacturing process variation for the respective chips and dependent on the cell position in the chip. In addition, the cell itself has a large resistance variation for the respective chips or the respective areas in a chip due to the composition variation of the recording layer.

Figure 1:
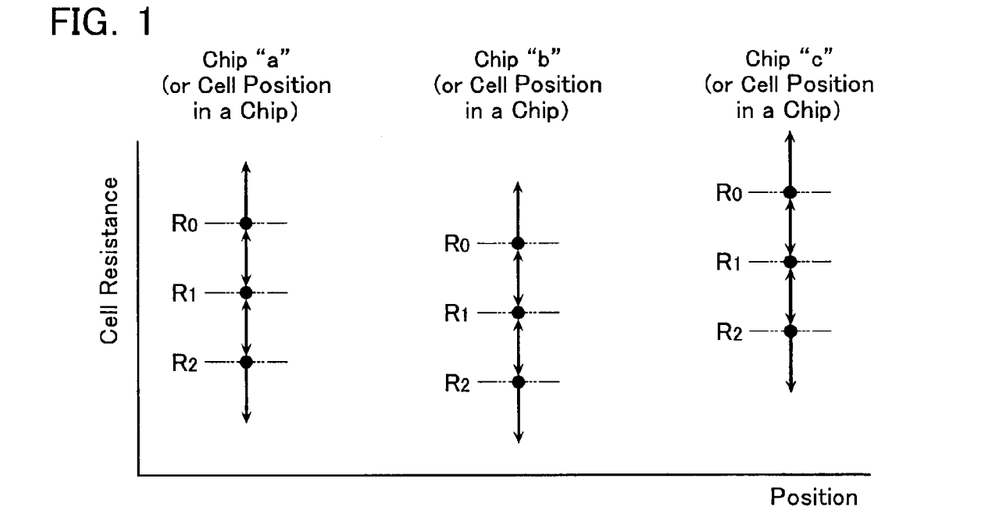
FIG. 1 is a diagram for showing the variation of the cell resistance value of a resistance change memory.

FIG. 1 shows such a situation that in case a multi-level storage scheme is adapted, boundary resistance values R0, R1 and R3 defining multiple levels of the cell resistance are different from each other for the respective chips (or cell positions in a chip) "a", "b" and "c". There is such a fear that it is not able to select a suitable reference level, i.e., a basic level for sensing the data levels.

To read out surely the cell's state under the above-described situation, it is in need of trimming and adjusting the reference levels (reference current values or boundary resistance values) of the reference cell, which serves as basic levels used at a write-verify time or data read time.

Illustrative embodiments of this invention will be explained with reference to the accompanying drawings below.

Figure 2:
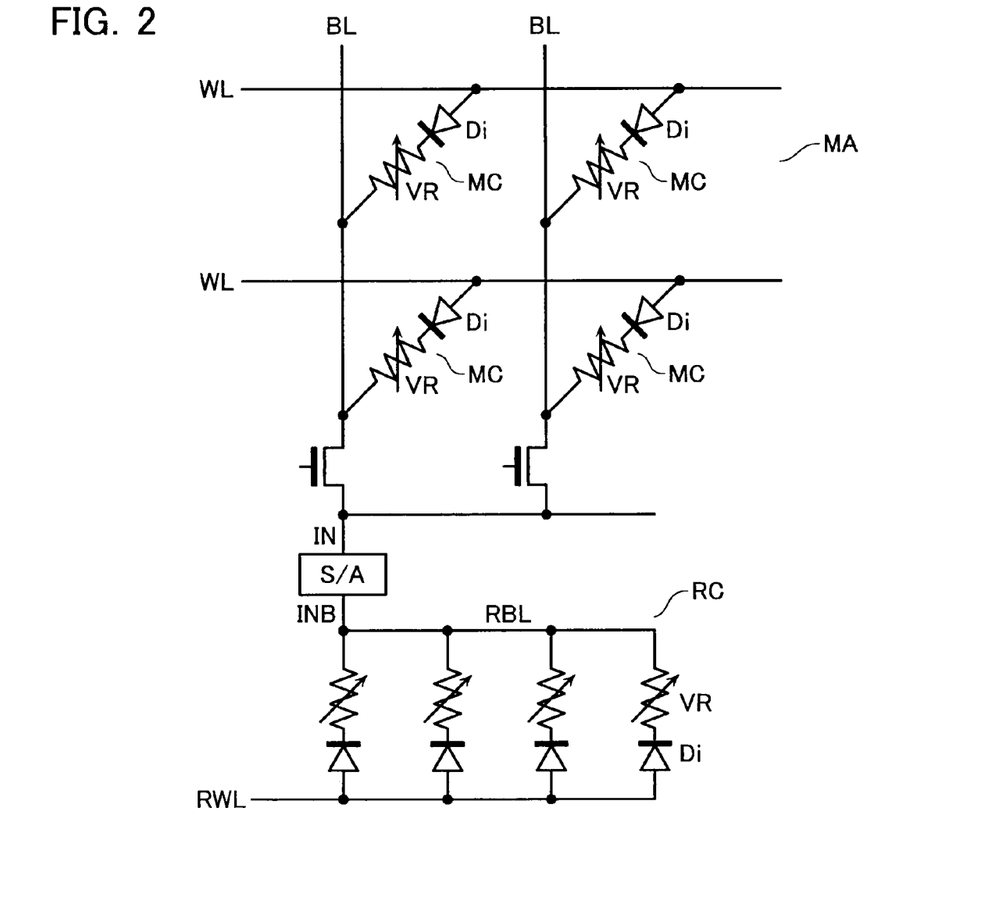
FIG. 2 shows a basic configuration of a memory cell array and a reference cell in accordance with an embodiment.

FIG. 2 shows a basic relationship between a memory cell array MA and a reference cell RC. Memory cell array MA has word lines WL and bit lines BL, which are disposed to cross each other, and memory cells MC disposed at the crosspoints, each of which has a variable resistance element VR and diode Di connected in series.

The variable resistance element VR has a recording layer formed of, for example, a transition metal oxide, which has a high resistance state defined as a reset state (i.e., a thermally stable state), and a low resistance state (i.e., set state) obtained by applying voltage. The cell in the low resistance state may be set in the high resistance state through a thermal process with Joule's heat generated by voltage application.

Sense amplifier S/A, which is used for detecting cell current carried in a bit line at a read time, is of a current detecting type. One input node IN is coupled to a bit line selected from multiple bit lines while the other input node INB is coupled to a reference cell RC. That is, the sense amplifier S/A compares a selected cell's current on a selected bit line with the reference current of the reference cell RC, and detects cell data.

The reference cell RC has the same cell array configuration in principle as the memory cell array MA. The variable resistance element VR in the reference cell RC is set in the high resistance state, and a plurality of the cell units are connected in parallel so that a certain reference current flows in the reference bit line RBL. For example, in the example shown in FIG. 2, four memory cells are connected in parallel, so that the reference current is set between a cell current of the high resistance state cell and that of the low resistance state cell. Therefore, it becomes possible to detect a selected cell's current in comparison with the reference current.

In this embodiment, the above-described reference cell RC is constituted as an adjustable mini-cell array. This will be explained in detail below.

Figure 3:
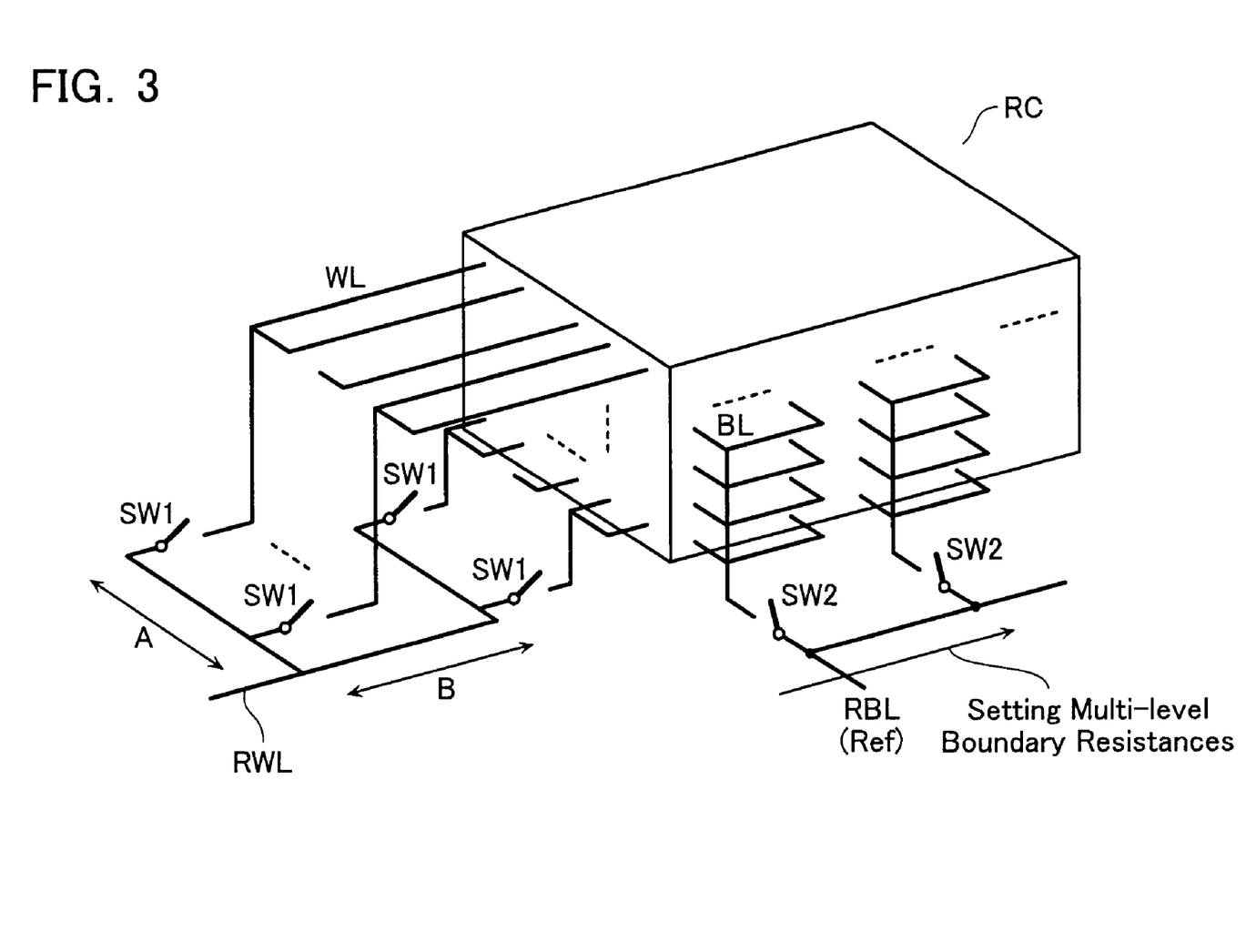
FIG. 3 shows a configuration of a reference cell.

FIG. 3 shows an adjustable reference cell RC. This example shows that, in case the memory cell array for storing data is formed with a three-dimensional structure, the reference cell RC is formed with the same three-dimensional structure as that of the memory cell array. This reference cell RC is different from the data storage-use memory cell array in the following matters: all cells are set in a state with the highest resistance value; and a number of word lines WL and a number of bit lines BL are connected in common with each other, respectively.

In detail, here is shown that word lines WL are connected in parallel two by two, and the word line groups of the respective two word lines are selectively coupled to a reference word line RWL via switches SW1. Similarly, a number of bit lines BL in a layer, and the respective bit lines stacked among different layers are connected in parallel to constitute bit line groups, which are selectively coupled to a reference bit line RBL via switches SW2.

Trimming is performed together with such a scanning operation that while one of switches SW2 on the bit line side is kept on, i.e., one bit line group is coupled to the reference bit line RBL, switches SW1 on the word line side are sequentially turned on. In accordance with this scanning A in a layer, the number of parallel-connected word lines (i.e., the number of parallel-connected cells) is increased gradually until when the resistance value of the reference cell becomes lower than that of a monitor cell. Combining another scanning B for going to other layers, the number of parallel-connected word lines may be further increased.

In case monitor cell's current is larger than that of the reference cell at a switch SW1 is on, the following switch SW1 is turned on in accordance with the scanning A. Detecting that the reference cell's current becomes larger than the monitor cell's current at a certain sense cycle, the ON/OFF state of the switches SW1, which has been obtained by the scanning A so far, will be fixed. As a result, a reference current value of the reference cell, i.e., a boundary resistance value, is determined.

Monitor cell is previously written into a high resistance state. Therefore, trimming is performed in such a manner that the sum of the cell's resistance and parasitic resistance appears to be in the highest resistance state for the sense amplifier. If the parasitic resistance is large, and the high resistance state including the parasitic resistance is extremely high, the input level may be in the insensible range of the sense amplifier formed for sensing minute current. Performing the above-described trimming scan in consideration of the insensible range, it becomes possible to make certainly the reference current value smaller than the cell's current of the monitor cell.

Although there are switches SW2 on the bit line side for increasing the number of bit lines coupled to the reference bit line RBL, these switches SW2 are not used for the trimming scan. Selecting the switches SW2, it becomes possible to set multiple reference current values in case of a multi-level data storage scheme. For example, assuming that the reference resistance value is set at R3 in the above-described trimming scan, it is required of multi-level data reading to use reference resistance R1 or R2 smaller than R3 (R1<R2<R3).

At a cell data read time, a selected word line is applied with read voltage, and a reference word line RWL in the corresponding reference cell array block is applied with the same read voltage simultaneously. On this condition, data sense is performed in such a way that a selected cell's current is compared with the reference current between a selected bit line and a reference bit line RBL. At a multi-level data read time, selecting switches SW2, and increasing the bit line groups coupled to the reference bit line RBL, the reference current value is exchanged to be adapted for judging multi-level data.

Figures 4A, 4C:
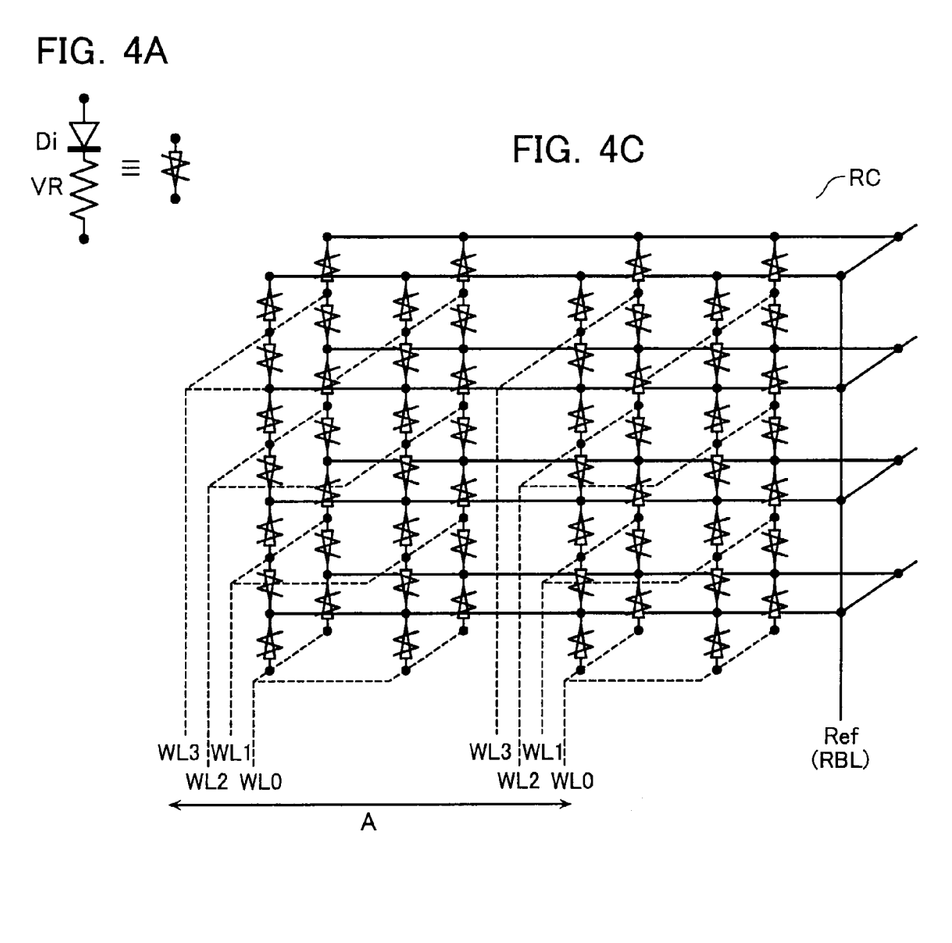
FIG. 4 shows the detailed configuration of the reference cell.
Figure 4B:
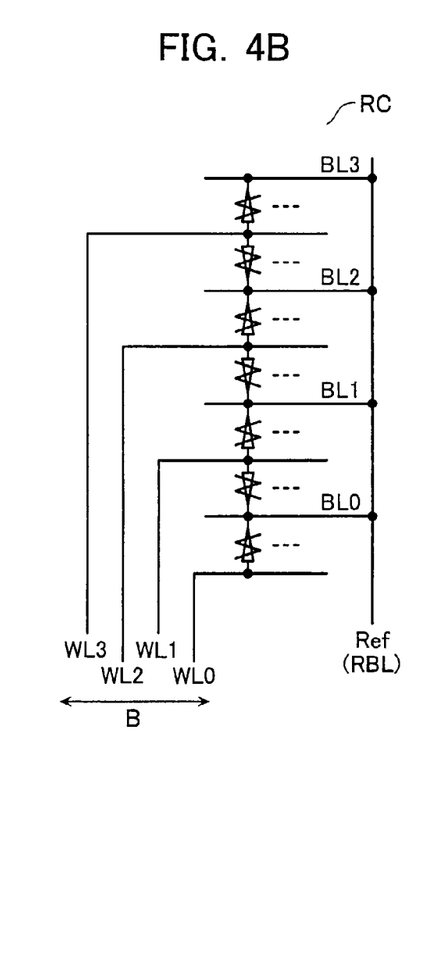

FIGS. 4A to 4C show the detailed configuration of the reference cell RC. FIG. 4A shows a symbol of a unit cell formed of variable resistance element VR and diode Di connected in series as similar to memory cell MC. FIG. 4B shows one column of seven-layered structure, and FIG. 4C shows a three-dimensional reference cell structure, in which the above-described columns are arranged two-dimensionally.

Seven-layered unit cells are stacked in such a manner that the diodes are reversed in polarity sequentially in the stacking direction, and adjacent two unit cells disposed in the stacking direction share a word line or a bit line. In the range shown in FIG. 4B, there are four bit lines BL0-BL3 and four word lines WL0-WL3. Four word lines WL0-WL3 are drawn independently of each other while four bit lines BL0-BL3 are coupled in common to a reference signal line Ref (i.e., reference bit line RBL).

A word line selecting operation for coupling word lines between adjacent layers corresponds to the above-described trimming scan B. As shown in FIG. 4C, in a certain layer, each multiple word lines are coupled in parallel. In the example shown in FIG. 4C, adjacent word lines are coupled two by two in each layer.

How many word lines are coupled in parallel is defined by a desirable reference cell configuration, and it decides the trimming precision. As the number of parallel-connected word lines becomes larger, the variation range of the reference cell current becomes larger, and the number of trimming scan processes is reduced while the trimming precision will be reduced. By contrast, as the number of word line coupled in parallel becomes smaller, the variation range of the reference cell current becomes less, and trimming precision is increased while the number of trimming scan processes will be increased. Therefore, the number of parallel-connected word lines should be set at a suitable value in accordance with the situation.

Figure 5:
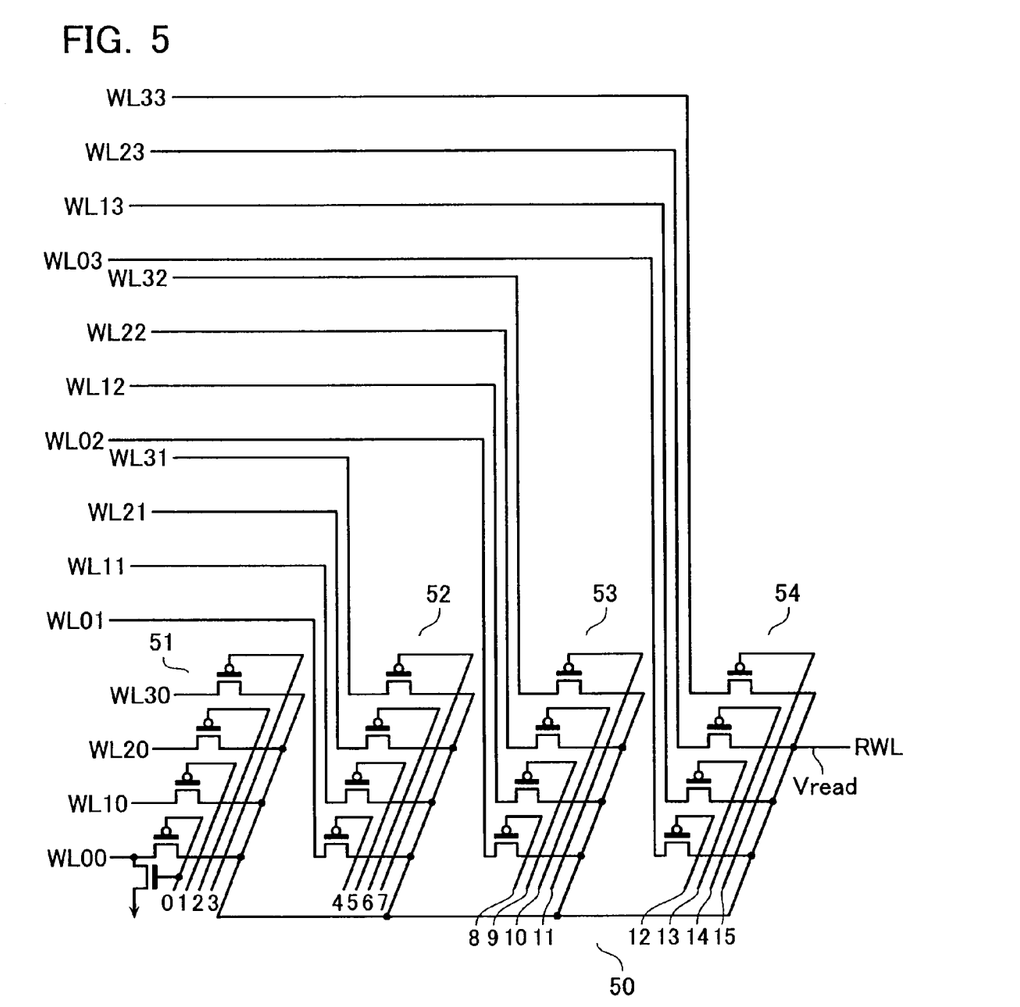
FIG. 5 shows a word line selecting decoder of the reference cell.

FIG. 5 shows a word line decoder 50 for performing the word line scan when trimming the reference cell RC. It is shown here such a case that a word line group is a bundle of four word lines as follows: a first layer of word line group of WL00-WL30; a second layer of word line group of WL01-WL31; a third layer of word line group of WL02-WL32; and fourth layer of word line group of WL30-WL33.

In one word line group, WLxy, "y" designates layer number while "x" designates position number in the layer. Therefore, scanning "x" corresponds to the trimming scan A while scanning "y" corresponds to the trimming scan B.

To sequentially supply read voltage Vread to the above-described word line groups through the reference word line RWL, P-channel transistor arrays 51, 52, 53 and 54 are disposed for the respective groups as being corresponded to switches SW1 shown in FIG. 3. One ends of the P-channel transistors are coupled to the word lines, respectively, while the other ends are coupled in common to the reference word line RWL.

Selection signal will be sequentially supplied to the gates of the transistor arrays. Here, numeral "n" (=0~15) designates the selection signal and generating order thereof, and it becomes "L" from "H" in order of selection. That is, the orders of the selection signal becoming "L", 0→1→2→3, 4→5→6→7, 8→9→10→11 and 12→13→14→15, correspond to the above-described trimming scan A while the level transitions of 3→4, 7→8 and 11→12 correspond to the trimming scan B.

In case a P-channel transistor is not turned on, to set the corresponding word lines in a non-selected state of Vss, N-channel transistors are disposed to constitute pairs with P-channel transistors, respectively, and supplied with the same selection signals as P-channel transistors. Although, in FIG. 5, it is shown that only one N-channel transistor is coupled to word line WL00, it should be noted that N-channel transistors are disposed in practice for all word lines.

Figure 6:
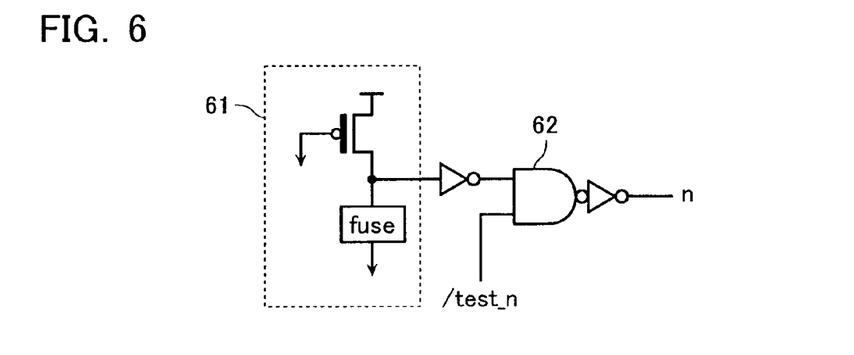
FIG. 6 shows a state holding circuit used for fixing the word line selection state.

FIG. 6 shows a signal generating circuit for generating selection signal "n". This signal generating circuit has fuse latch 61 for serving as a state holding circuit, and gate portion 62 for outputting control signal "/test_n" in accordance with the state of fuse latch 61. A plurality of the same signal generating circuits as shown in FIG. 6, i.e., sixteen circuits in the example shown in FIG. 5, are arranged to be supplied with the control signal "/test_n".

It should be appreciated that the control signal "/test_n" may be generated as an inner-chip signal based on the external signal generated by a tester at a die sort time after manufacturing the memory chips, or may be automatically generated by an inner counter formed in the chip. Sequentially generated control signals "/test_n" are supplied as the selection signals "n" to be applied to P-channel transistor arrays.

All signals "n" generated until when the trimming becomes "OK" are kept at "L" in the fuse latches 61.

Fuse latch 61 is formed of a P-channel transistor and a fuse connected in series. While the fuse is not cut, it outputs "L", thereby making the NAND gate in the gate portion 62 inactive. In this state, the control signal "/test_n" is output as the selection signal "n" as it is. When the fuse is cut, gate portion 62 is made to be active, and the selection signal "n" is fixed at "L" hereinafter.

Although, in the example shown in FIG. 6, a fuse is used for fixing a selection state, another method, for example, a non-volatile memory may be used as serving as the state holding circuit in place of the fuse. The non-volatile memory will be formed as similar to the resistance change memory cell. It should be noted that other devices may be used if these are able to store a once-set state almost permanently.

By use of the above-described selection signal "n", it becomes possible to use the reference cell trimmed for the corresponding cell area at any time.

Figure 7:
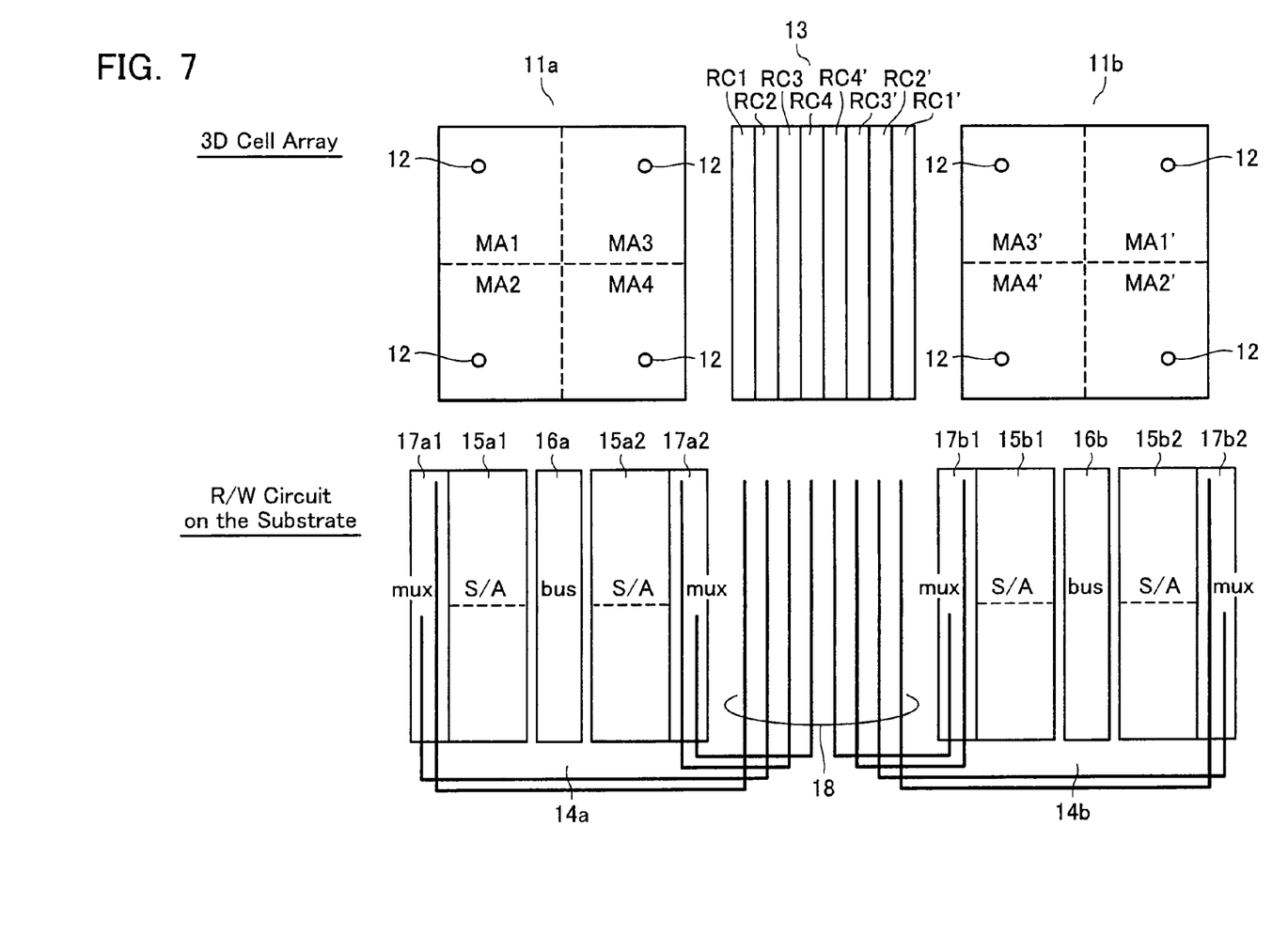
FIG. 7 shows a layout of the memory cell array and the reference cell array in association with the circuit on the substrate.

FIG. 7 shows the three-dimensional (3D) ReRAM in accordance with this embodiment in a plane figure. There are shown here two cell arrays 11a and 11b, and reference cell array 13 disposed between the cell arrays 11a and 11b to be used by them. These cell arrays are formed as three-dimensional (3D) ones. In practice, cell arrays 11a, 11b and reference cell array 13 constitute a unit bank, and plural banks are arranged.

Cell arrays 13a and 13b are divided into four areas MAi and four areas MAi' (i=1 to 4), respectively. These areas MAi, MAi' will be referred to as "divided areas" hereinafter. In the reference cell array 13, eight reference cells RCi and RCi' (i=1 to 4) are disposed as corresponding to the respective divided areas MAi and MAi'.

In the respective divided areas MAi and MAi' of the cell arrays 11a and 11b, monitor cells 12 are prepared to be used at the respective trimming times of the reference cells RCi and RCi' in the reference cell array 13. Each monitor cell 12 is written into a certain resistance state (for example, a high resistance state). Compare a reference cell's state with the monitor cell's state, and the reference cell will be trimmed.

There is no problems basically in the position relationship between the reference cell RCi, RCi' in the reference cell array 13 and the divided areas MAi, MAi' in the cell arrays 11a, 11b because the influences of the position relationship are absorbed and amended. However, considering easiness of trimming, economical wiring layout and the like, it is desired to arrange them with a position relationship being as symmetric as possible. In the example shown in FIG. 7, the cell arrays 11a, 11b and reference cell array 13 are arranged and divided in consideration of the above-described situation.

In the example, 3D cell array is shown in a plane figure. To deal with the variation of the cell array in the stacking direction, it is desired to further divide the 3D cell array into a lower layered part and an upper layered part, and dispose monitor cells in the respective parts independently. In this case, the reference cell array 13 will be divided into twice blocks in comparison with that shown in FIG. 7.

Read/write circuits 14a and 14b are disposed on the semiconductor substrate underlying the cell arrays 11a and 11b, respectively. These read/write circuits 14a and 14b have data buses 16a and 16b disposed at the center positions thereof and sense amplifier arrays (15a1, 15a2) and (15b1, 15b2) disposed on the both sides of the data buses, respectively.

Bit line drawing lines from the cell arrays 11a and 11b to the sense amplifier arrays (15a1, 15a2) and (15b1, 15b2) are omitted in FIG. 7. Bit lines in the cell arrays 11a, 11b are coupled to the sense amplifier arrays through via wirings (not shown) and multiplexers (17a1, 17a2) and (17b1, 17b2).

Reference bit lines in the reference cell array 13 also are contacted with the substrate through via wirings, and coupled to the corresponding sense amplifiers in the sense amplifier arrays (15a1, 15a2) and (15b1, 15b2) via multiplexers (17a1, 17a2) and (17b1, 17b2).

These wiring line connections are performed in parallel for the sense amplifiers corresponding to the respective cell array areas MA1-MA4 and MA1'-MA4'.

Figure 8:
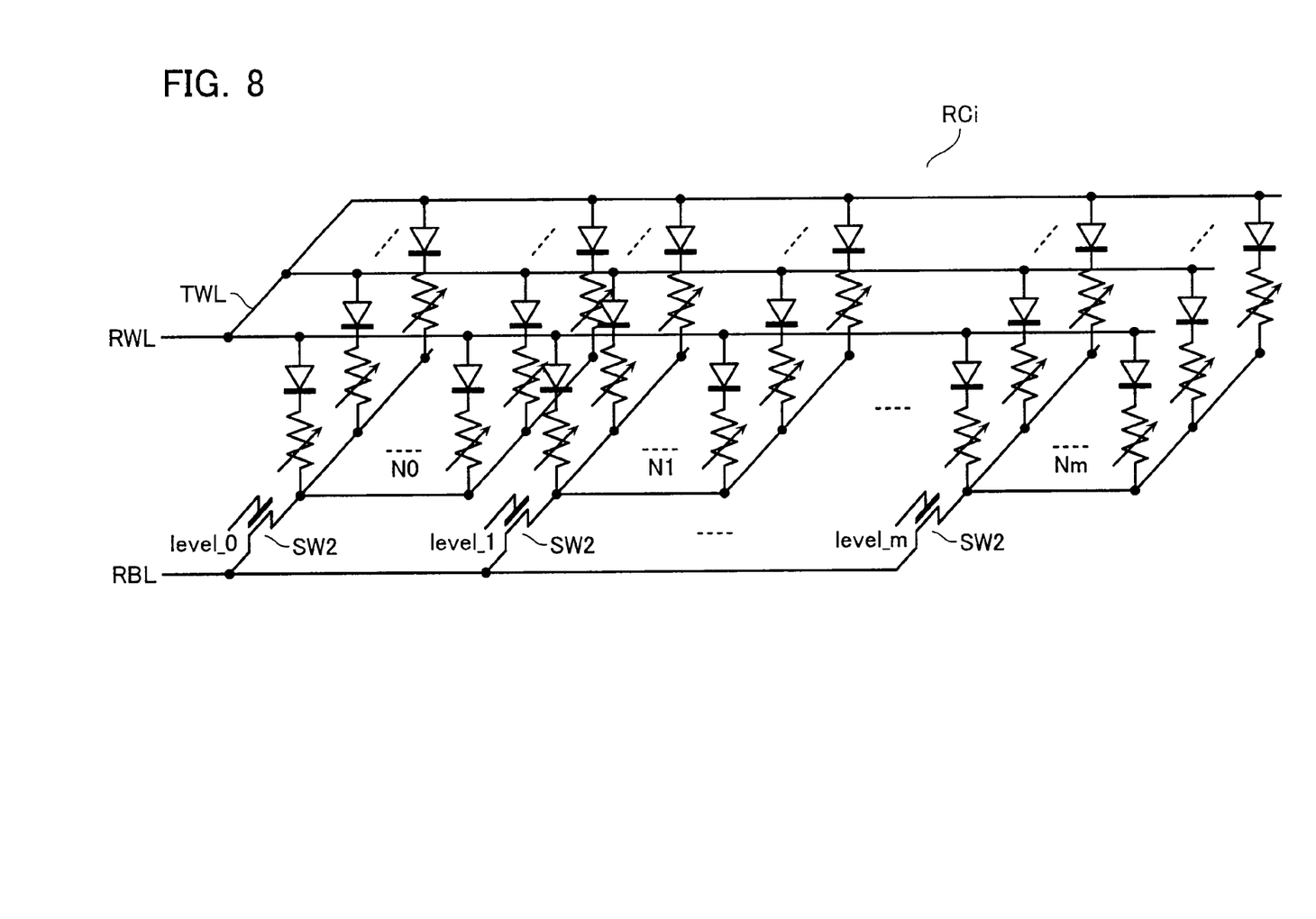
FIG. 8 shows a reference cell structure as a single layer in case of multi-level data storage scheme.

Next, in case of a multi-level data storage scheme, it will be explained with reference to FIG. 8 a method of setting multi-level in the reference cell RCi. In FIG. 8, the reference cell RCi is shown as one cell layer in such a way that all active word lines connected in parallel after trimming are referred to as trimmer word line TWL. The trimmer word line TWL serves as the reference word line RWL.

On the bit line side, it is shown that there are multiple bit line groups, in which bit line numbers are set at N0, N1, . . . , Nm, and the bit line groups are selectively coupled to the reference bit line RBL via switches SW2 driven by selection signals level_1, level_2, . . . , level_m. That is, in accordance with the selection signals, the bit line groups with different bit line numbers may be selected.

Firstly, at a trimming time, selection signal level_0 is set to be "H", thereby turning on one of the switches SW1 coupled to a bit line group with the bit line number N0. The monitor cell and the unit cell in the reference cell is in the highest resistance state. After trimming, the bit line group with the bit line number N0 is set in a lower resistance state than the monitor cell in consideration of the parasitic resistance. The reference cell's current becomes slightly less than the monitor cell's current. Here, the resistance value of the reference cell (i.e., boundary resistance value) determined as described above is referred to as R0 while the current (i.e., reference current) is referred to as I0.

Note here that since the bit line group with the bit line number N0 is always used at read times hereinafter, switch SW2 at this part may be omitted.

A method of setting multiple reference levels, which are used for reading multiple data levels, will be explained below. In a multi-level data storage scheme, one memory cell stores either one of three or more resistance values defined by two or more boundary resistance values. For example, in a four-level data storage scheme, one memory cell stores one of four resistance value states defined by three boundary resistance values R0, R1 and R2 (where, R0>R1>R2).

To set the boundary resistance values R1, R2, . . . in the order of the resistance value height from R0, switches SW2 are sequentially turned on. This operation is equivalent to that the numbers of simultaneously selected cells are sequentially exchanged because unit cells are set at the identical resistance value in the reference cell array RCi.

That is, in order to set the boundary resistance value R1 lower than R0, following R0, set the selection signal level_1 to be "H", thereby increasing the number of simultaneously selected bit lines to be N1+N0. Assuming that the cell current corresponding to the boundary resistance value R1 is I1, there is the relationship of: $N1/N0=(I1-I0)/I0$. Therefore, to sufficiently cover the variation of the set resistance value, decide resistance value R1, i.e., current value I1, and decide the number N1. At this time, in consideration of the variation of the cell's resistance in the reference cell, it is desired to secure a sufficiently large margin.

Similar to the above-described method, to set the boundary resistance value Rm, set the selection signal level_m to be "H", thereby increasing the number of simultaneously selected bit lines by Nm. Since the ratio of current difference (Im-Im-1) to current I0 is equal to the ratio of the bit line numbers Nm to N0, the multi-level sections may be designed by selecting Nm.

Figure 9:
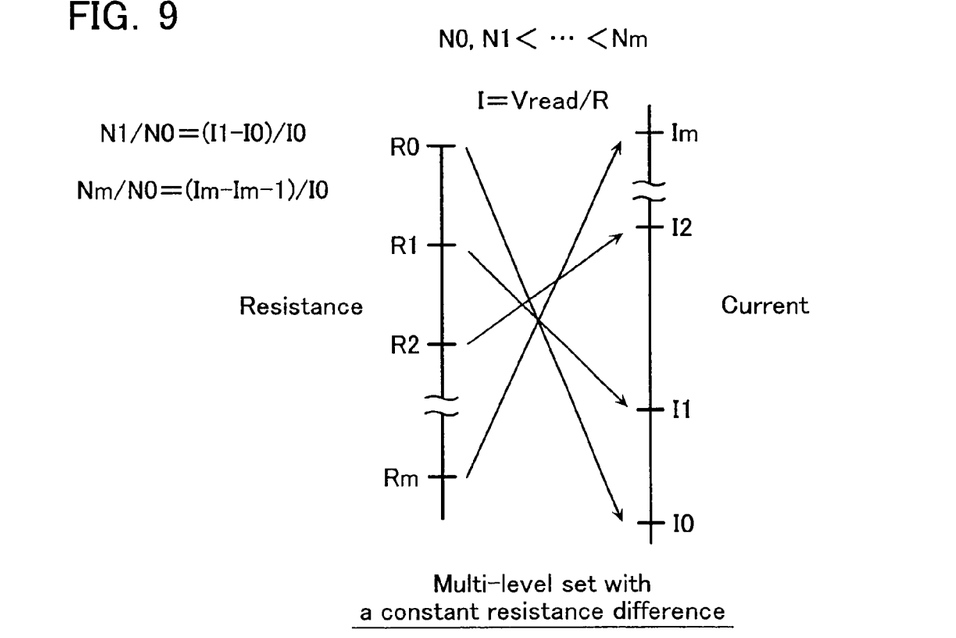
FIG. 9 shows a multi-level setting method, in which the boundary resistance difference is made to be constant.
Figure 10:
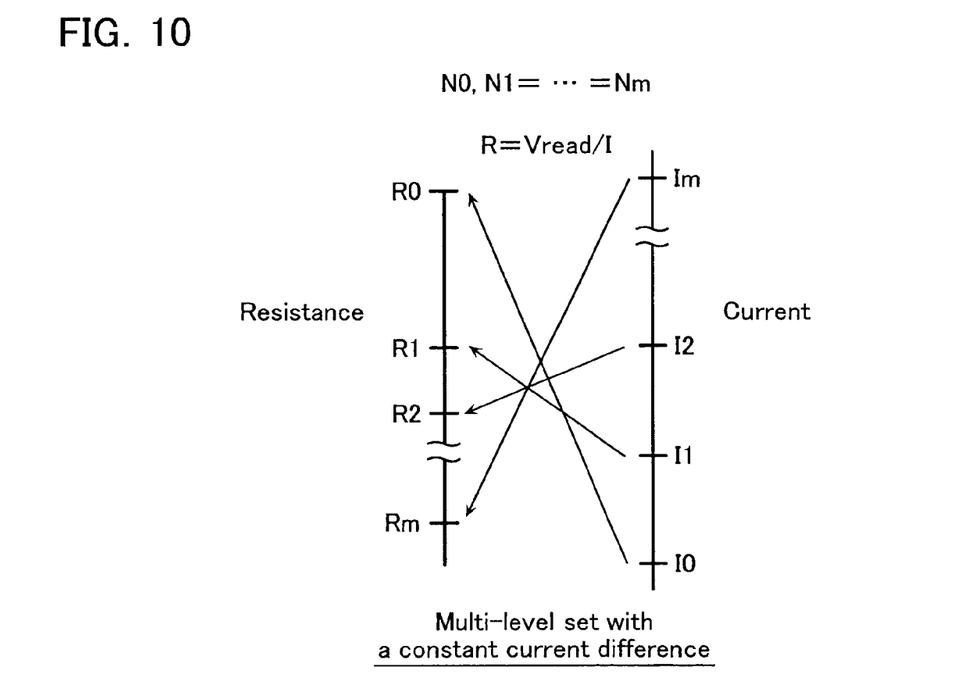
FIG. 10 shows another multi-level setting method, in which the reference current difference is made to be constant.

FIGS. 9 and 10 show two cases with different methods for designing the boundary resistance values.

FIG. 9 shows a case where multiple levels are set with a constant difference between the respective boundary resistances. That is, resistance gaps between the respective multi-level resistance sections are set to be constant as follows: $R1-R0=R2-R1= . . . =Rm-Rm-1$. In this case, since cell current increases in inverse proportion to the multi-level resistance decrease, the bit line numbers satisfy the following relationship: $N1<N2< . . . <Nm$.

FIG. 10 shows another case where multiple levels are set with a constant difference between the respective boundary cell currents. That is, current gaps between the respective multi-level resistance sections are set to be constant as follows: $I1-I0=I2-I1= . . . =Im-Im-1$. Since the current increase is constant, the bit line numbers satisfy the following relationship of: $N1=N2= . . . =Nm$. In this case, the cell resistance is inversely proportional to the cell current, and the cell current decreasing gap becomes less in accordance with the multi-level resistance decrease.

The features in the above-described embodiment will be summarized as follows:

(1) In a resistance change memory device with a recording layer, the resistance state of which is changed by applying voltage, current or heat, there is prepared a reference cell, which has the same cell structure as the memory cell array storing data, and contains a number of cells less than the memory cell array. The reference cell is formed in such a manner that the reference current value may be trimmed by selecting the number of parallel-connected word lines, i.e., parallel-connected cells.

(2) The reference cell includes: a plurality of word line groups, in each of which includes two or more parallel-connected word lines; a plurality of bit line groups, in each of which includes two or more parallel-connected bit lines; and switch groups configured to sequentially change and select the number of word line groups simultaneously selected. Selecting the word line numbers, i.e., the number of parallel-connected cells, the reference cell current value used for sensing data of the memory cell array is trimmed.

There is further prepared a state holding circuit used for fixing the on/off states of the switch groups to make the trimmed reference current value fixedly usable.

(3) In case of a multi-level data storage scheme, the reference cell includes: a plurality of word line groups, in each of which includes multiple parallel-connected word lines; a plurality of bit line groups, in each of which includes multiple parallel-connected bit lines; first switch groups configured to couple a number of the word line groups to a reference word line; second switch groups configured to couple a number of the bit line groups to a reference bit line; and a state holding circuit used for fixing the on/off states of the first switch groups.

The reference current value is trimmed in such a way as to sequentially increase the selection numbers of the word line groups with the first switch groups while one bit line group is used, and compare the cell currents at the respective selection numbers with that of a monitor cell. The state holding circuit fixes the on/off state of the first switch groups, so that the trimmed reference current value is held.

Multiple reference current values used for reading multi-level data will be set by sequentially turning on the second switch groups.

This invention is not limited to the above-described embodiment. It will be understood by those skilled in the art that various changes in form and detail may be made without departing from the spirit, scope, and teaching of the invention.

What is claimed is:

1. A resistance change memory device comprising:
a memory cell array with memory cells arranged therein, the memory cell having a variable resistance element for storing a rewritable resistance value;
a reference cell trimmed with selection of the number of parallel-connected memory cells to have a reference current value used for detecting data in the memory cell array; and
a sense amplifier configured to compare a cell current value of a memory cell selected in the memory cell array with the reference current value of the reference cell, wherein
both the memory cell array and the reference cell are formed of memory cells arranged three-dimensionally.

2. The resistance change memory device according to claim 1, wherein
a plurality of the reference cells are disposed in correspondence with a plurality of areas in the memory cell array.

3. The resistance change memory device according to claim 1, wherein
a plurality of the reference cells are disposed in correspondence with a plurality of areas in the memory cell array, and the numbers of parallel-connected memory cells in the reference cells are trimmed by use of current comparison between the reference current values and cell current values of monitor cells disposed in the respective areas.

4. The resistance change memory device according to claim 1, wherein
the reference cell comprises:
a plurality of word line groups each having multiple word lines connected in parallel, to which one ends of memory cells are coupled;
a bit line group having multiple bit lines connected in common to a reference bit line, the other ends of the memory cells being coupled to the bit lines;
switch groups configured to selectively couple the word line groups to a reference word line; and
wherein
the reference current value is trimmed in such a way as to sequentially increase the selection numbers of the word line groups with the switch groups driven, and compare the reference cell current with a monitor cell's current in the memory cell array.

5. The resistance change memory device according to claim 4, wherein
the reference cell further comprises a state holding circuit configured to fix the on/off state of the switch groups, thereby keeping the trimmed reference current value of the reference cell.

6. The resistance change memory device according to claim 1, wherein
the memory cell array stores such multi-level data that one memory cell stores one selected in three or more resistance value states, and the reference cell comprises:
a plurality of word line groups each having multiple word lines connected in parallel, to which one ends of memory cells are coupled;
a plurality of bit line groups each having multiple bit lines connected in parallel, to which the other ends of the memory cells are coupled;
first switch groups disposed between the word line groups and a reference word line; and
second switch groups disposed between the bit line groups and a reference bit line, and wherein
the reference current value is trimmed in such a way as to sequentially increase the selection numbers of the word line groups with the first switch groups driven in a state where one of the bit line groups is active, and compare the reference cell current with a monitor cell's current in the memory cell array.

7. The resistance change memory device according to claim 6, wherein
a plurality of the reference current values are set with the second switches sequentially turned on at a read time of the multi-value data.

8. The resistance change memory device according to claim 6, wherein
the reference cell further comprises a state holing circuit configured to fix the on/off state of the first switch groups, thereby keeping the trimmed reference current value of the reference cell.

9. The resistance change memory device according to claim 6, wherein
the multi-level data is defined by two or more boundary resistance values, the differences between the respective boundary resistances being set to be constant.

10. The resistance change memory device according to claim 6, wherein
the multi-level data is defined by two or more boundary resistance values, the differences between cell currents at the respective boundary resistances being set to be constant.

11. A resistance change memory device comprising:
a memory cell array with memory cells arranged therein, the memory cell including a variable resistance element for storing a rewritable resistance value;
a reference cell array with reference cells arranged therein, the reference cells being disposed in correspondence with the respective divided areas defined in the memory cell array; and
a sense amplifier configured to compare a cell current value of a memory cell selected in the memory cell array with a reference current value of a reference cell selected in the reference cell array, wherein
the reference cells each include parallel-connected memory cells, and reference current values of the reference cells are trimmed in such a way as to select the number of parallel-connected memory cells and compare the cell currents with those of monitor cells defined in the respective divided areas,
the reference cell comprises:
a plurality of word line groups each having multiple word lines connected in parallel, to which one ends of memory cells are coupled;
a bit line group having multiple bit lines connected in common to a reference bit line, the other ends of the memory cells being coupled to the bit lines;
switch groups configured to selectively couple the word line groups to a reference word line; and wherein
the reference current value is trimmed in such a way as to sequentially increase the selection numbers of the word line groups with the switch groups driven, and compare the reference cell current with the monitor cell's current.

12. The resistance change memory device according to claim 11, wherein
both the memory cell array and the reference cell are formed of memory cells arranged three-dimensionally.

13. The resistance change memory device according to claim 11, wherein the reference cell further comprises a state holding circuit configured to fix the on/off state of the switch groups, thereby keeping the trimmed reference current value of the reference cell.

14. A resistance change memory device comprising:
a memory cell array with memory cells arranged therein, the memory cell including a variable resistance element for storing a rewritable resistance value;
a reference cell array with reference cells arranged therein, the reference cells being disposed in correspondence with the respective divided areas defined in the memory cell array; and
a sense amplifier configured to compare a cell current value of a memory cell selected in the memory cell array with a reference current value of a reference cell selected in the reference cell array, wherein
the reference cells each include parallel-connected memory cells, and reference current values of the reference cells are trimmed in such a way as to select the number of parallel-connected memory cells and compare the cell currents with those of monitor cells defined in the respective divided areas,
the memory cell array stores such multi-level data that one memory cell stores one selected in three or more resistance value states, and the reference cell comprises:
a plurality of word line groups each having multiple word lines connected in parallel, to which one ends of memory cells are coupled;
a plurality of bit line groups each having multiple bit lines connected in parallel, to which the other ends of the memory cells are coupled;
first switch groups disposed between the word line groups and a reference word line; and
second switch groups disposed between the bit line groups and a reference bit line, and wherein
the reference current value is trimmed in such a way as to sequentially increase the selection numbers of the word line groups with the first switch groups driven in a state where one of the bit line groups is active, and compare the reference cell current with the monitor cell's current.

15. The resistance change memory device according to claim 14, wherein
a plurality of the reference current values are set with the second switches sequentially turned on at a read time of the multi-value data.

16. The resistance change memory device according to claim 14, wherein
the reference cell further comprises a state holding circuit configured to fix the on/off state of the first switch groups, thereby keeping the trimmed reference current value of the reference cell.

17. The resistance change memory device according to claim 14, wherein
the multi-level data is defined by two or more boundary resistance values, the differences between the respective boundary resistances being set to be constant.

18. The resistance change memory device according to claim 14, wherein
the multi-level data is defined by two or more boundary resistance values, the differences between cell currents at the respective boundary resistances being set to be constant.

19. The resistance change memory device according to claim 1, wherein
the reference cell is formed of the same memory cells as those set in a high resistance state in the memory cell array.

20. The resistance change memory device according to claim 11, wherein
the reference cells are formed of the same memory cells as those set in a high resistance state in the memory cell array.

21. The resistance change memory device according to claim 14, wherein
the reference cells are formed of the same memory cells as those set in a high resistance state in the memory cell array.

* * * * *